(12) United States Patent
Koyanagi et al.

(10) Patent No.: US 8,879,335 B2
(45) Date of Patent: Nov. 4, 2014

(54) INPUT CIRCUIT

(75) Inventors: Masaru Koyanagi, Tokyo (JP);
Mikihiko Itoh, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 353 days.

(21) Appl. No.: 13/424,707

(22) Filed: Mar. 20, 2012

(65) Prior Publication Data
US 2012/0250423 A1 Oct. 4, 2012

(30) Foreign Application Priority Data

Mar. 31, 2011 (JP) .................................. 2011-81064

(51) Int. Cl.
*G11C 7/10* (2006.01)
*H03K 19/0175* (2006.01)

(52) U.S. Cl.
CPC .............................. *H03K 19/017527* (2013.01)
USPC ...... 365/189.05; 365/193; 365/194; 365/207; 327/108

(58) Field of Classification Search
CPC ....... G11C 7/10; G11C 16/06; H03K 19/0175
USPC .............. 365/189.05, 193, 194, 207; 327/108
See application file for complete search history.

(56) References Cited

U.S. PATENT DOCUMENTS

| | | | |
|---|---|---|---|
| 5,955,896 A * | 9/1999 | Horiguchi et al. .............. | 326/95 |
| 6,317,369 B1 | 11/2001 | Kubo et al. | |
| 6,677,797 B2 | 1/2004 | Kameyama et al. | |
| 6,807,108 B2 * | 10/2004 | Maruyama et al. ...... | 365/189.05 |
| 7,266,022 B2 | 9/2007 | Aoki | |
| 2005/0116746 A1 * | 6/2005 | Lee et al. ...................... | 327/108 |
| 2006/0220701 A1 * | 10/2006 | Song .............................. | 327/108 |
| 2009/0185413 A1 * | 7/2009 | Kim et al. ...................... | 365/174 |

FOREIGN PATENT DOCUMENTS

| | | |
|---|---|---|
| CN | 1362743 A | 8/2002 |
| EP | 1 220 450 A2 | 7/2002 |
| JP | 2000-339957 | 12/2000 |
| JP | 2001-67864 | 3/2001 |
| JP | 2006-260322 | 9/2006 |

OTHER PUBLICATIONS

Office Action issued on Jan. 27, 2014 in the corresponding Chinese Patent Application No. 2012100709786 (with English Translation).
Japanese Office Action issued Oct. 29, 2013, in Japan Patent Application 2011-081064 (with English translation).
Japanese Office Action issued Mar. 26, 2013 in Patent Application No. 2011-081064 with English Translation.

* cited by examiner

*Primary Examiner* — Toan Le
(74) *Attorney, Agent, or Firm* — Oblon, Spivak, McClelland, Maier & Neustadt, L.L.P.

(57) ABSTRACT

The first input circuit detects an input signal to output a first output signal having the same phase as the input signal. The second input circuit is configured to detect a first strobe signal to output a second output signal. The third input circuit is configured to detect a second strobe signal as a reversed signal of the first strobe signal to output a third output signal. A data latch circuit includes a first latch circuit and a second latch circuit. It is configured to latch the first output signal in either one of the first latch circuit or the second latch circuit according to the first output signal, the second output signal and the third output signal. It also allows the other one of the first latch circuit or the second latch circuit to input the first output signal thereto.

15 Claims, 9 Drawing Sheets

INPUT CIRCUIT

CROSS REFERENCE TO RELATED APPLICATIONS

This application is based on and claims the benefit of priority from prior Japanese Patent Application No. 2011-81064, filed on Mar. 31, 2011, the entire contents of which are incorporated herein by reference.

FIELD

Embodiments described herein relate to an input circuit.

BACKGROUND

Semiconductor integrated circuits such as semiconductor memory devices include an input circuit that receives an input signal at certain timing. The input circuit generally receives an input signal according to the timing when the logic of a strobe signal changes.

In a conventional semiconductor memory device such as a NAND-cell type flash memory, an interface of single-data rate (SDR) having a rate of about 40 Mbps is adopted. In recent years, it is required that an interface adopt an double-data rate (DDR), and that the DDR interface have a rate of 133 Mbps-200 Mbps or even higher speed to improve access efficiency of the NAND-cell type flash memory.

DETAILED DESCRIPTION

The input circuit according to the embodiments described herein comprises first to third input circuits. The first input circuit detects an input signal, outputs a first output signal having the same phase as the input signal.

The second input circuit is configured to detect a first strobe signal to output a second output signal. The third input circuit is configured to detect a second strobe signal as a reversed signal of the first strobe signal to output a third output signal. A data latch circuit includes a first latch circuit and a second latch circuit. It is configured to latch the first output signal in either one of the first latch circuit or the second latch circuit according to the first output signal, the second output signal and the third output signal. It also allows the other one of the first latch circuit or the second latch circuit to input the first output signal thereto.

Then, embodiments of the present invention will be described with reference to the drawings.

[First Embodiment]

First, the first embodiment will be described with reference to FIG. 1.

Figure 1:
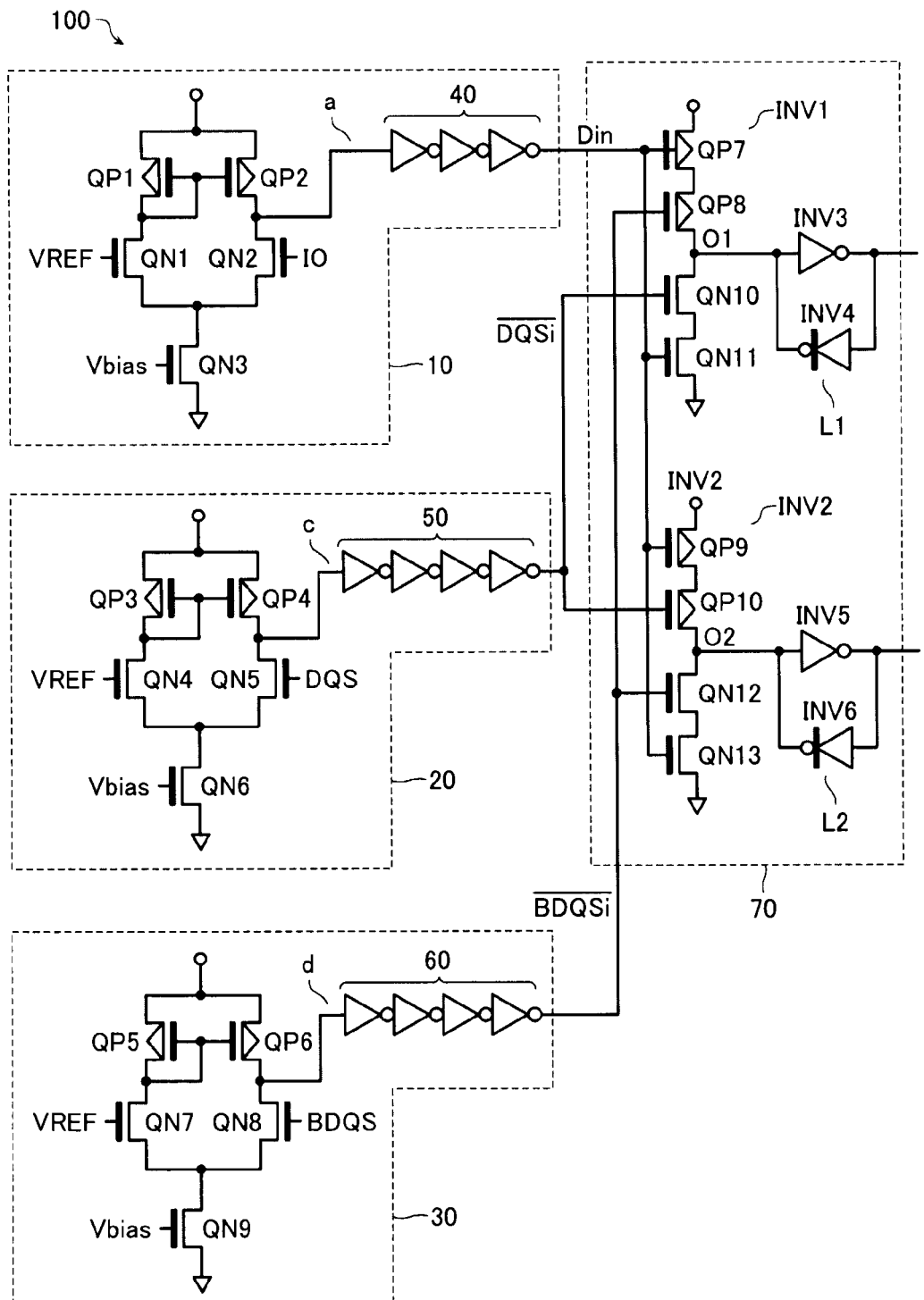
FIG. 1 is an equivalent circuit diagram illustrating a structure of an input circuit according to the first embodiment.

FIG. 1 is a circuit diagram showing the entire structure of the input circuit 100 according to the first embodiment. The input circuit 100 according to the first embodiment comprises a first differential amplifier circuit 10, a second differential amplifier circuit 20, a third differential amplifier circuit 30, and a data latch circuit 70. This input circuit 100 is configured to receive an input signal IO according to a logic change timing of a strobe signal DQS, or a strobe signal BDQS as a reversed signal of the strobe signal DQS. The details of the structure will be described below.

The NMOS transistor QN3 in the first differential amplifier circuit 10 functions as a constant current source when it is applied with a bias voltage Vbias at its gate. As a result, the first differential amplifier circuit 10 amplifies the difference between the input signal IO and a reference voltage (a reference signal) VREF to output a differentially-amplified signal a and a signal Din. The first differential amplifier circuit 10 includes PMOS transistors QP1, QP2, NMOS transistors QN1, QN2, QN3, and inverter circuits 40.

In FIG. 1, the inverter circuits 40 are illustrated as three inverters which are cascade-connected such that the logic of the signals is illustrated in a simplified manner. If similar logic of signals can be obtained, it is possible that a logic circuit such as a NAND gate or NOR gate, a transmission gate, or a delay circuit may be further included herein.

The PMOS transistors QP1 and QP2 each have a source connected to a power supply voltage terminal. The PMOS transistor QP1 is diode-connected, and its gate is connected to the gate of the PMOS transistor QP2.

The drains of the NMOS transistor QN1 and QN2 are connected to the drains of the PMOS transistor QP1 and QP2, respectively.

In addition, the gates of the NMOS transistor QN1 and QN2 are supplied with the reference voltage VREF and the input signal IO, respectively. The NMOS transistor QN3 is connected between the sources of the NMOS transistors QN1 and QN2 and a ground terminal. A gate of the NMOS transistor QN3 is applied with a voltage Vbias in an operation state. The NMOS transistor QN3 functions as a constant current source when it is applied with the bias voltage Vbias at its gate. As a result, the first differential amplifier circuit 10 is in an operable state by being applied with the bias voltage Vbias, and amplifies the difference between the input signal IO and the reference voltage VREF to output a differentially-amplified signal a. The differentially-amplified signal a is input to the inverter circuit 40. The inverter circuit 40 shapes the differentially-amplified signal a to output a signal Din having the same phase as the input signal IO. Here, "the same phase" means that the phase of the input signal IO is substantially the same as that of the signal Din.

On the other hand, the second differential amplifier circuit 20 has a structure substantially the same as that of the first differential amplifier circuit 10. It amplifies the difference between the strobe signal DQS and the reference voltage (reference signal) VREF to output a differentially-amplified signal c, and in addition, an output signal /DQSi. Specifically, the second differential amplifier circuit 20 includes PMOS transistors QP3, QP4, NMOS transistors QN4, QN5, QN6, and inverter circuits 50. In FIG. 1, the inverter circuits 50 are illustrated as four inverters which are cascade-connected, such that the logic of the signals is illustrated in a simplified manner. If similar logic of signals can be obtained, it is possible that a logic circuit such as a NAND gate or NOR gate, a transmission gate, or a delay circuit may be further included herein. The PMOS transistors QP3 and QP4 each have a source connected to a power supply voltage terminal. The PMOS transistor QP3 is diode-connected, and in addition, has a gate connected to the gate of the PMOS transistor QP4.

The drains of the NMOS transistors QN4 and QN5 are connected to the drain of the PMOS transistors QP3 and QP4, respectively. In addition, the gates of the NMOS transistors QN4 and QN5 are applied with the reference voltage VREF and the strobe signal DQS, respectively.

The NMOS transistor QN6 is connected between the sources of the NMOS transistors QN4 and QN5 and the ground terminal. In addition, its gate is applied with the bias voltage Vbias. The NMOS transistor QN6 functions as a constant current source when it is applied with the bias voltage at its gate. As a result, the second differential amplifier circuit 20 amplifies the difference between the strobe signal DQS and the reference voltage VREF to output a differentially-amplified signal c. The differentially-amplified signal c is input to the inverter circuits 50.

The inverter circuit 50 shapes the differentially-amplified signal c to output a signal /DQSi having a reversed phase of the input signal IO.

In addition, the third differential amplifier circuit 30 has substantially the same structure same as that of the first differential amplifier circuit 10. That is, it amplifies the difference between the strobe signal BDQS and the reference voltage (a reference signal) VREF, thereby outputting a differentially-amplified signal d and a signal /BDQSi. Specifically, the third differential amplifier circuit 30 includes PMOS transistors QP5, QP6, NMOS transistors QN7, QN8, QN9 and inverter circuits 60. In FIG. 1, the inverter circuits 60 are illustrated as four inverters which are cascade-connected, such that the logic of the signals are illustrated in a simplified manner. If similar logic of signals can be obtained, it is possible that a logic circuit such as a NAND gate or NOR gate, a transmission gate, or a delay circuit may be further included herein. The PMOS transistor QP5 and QP6 each have a source connected to a power supply voltage terminal. The PMOS transistor QP5 is diode-connected, and its gate is connected to the gate of the PMOS transistor QP6.

The drains of the NMOS transistors QN7 and QN8 are connected to the drains of the PMOS transistors QP5 and QP6, respectively. Also, the gates of the NMOS transistors QN7 and QN8 are applied with the reference voltage VREF and the strobe signal BDQS, respectively. The NMOS transistor QN9 is connected between the sources of the NMOS transistors QN7 and QN8 and a ground terminal. In addition, its gate is applied with the bias voltage Vbias. The NMOS transistor QN9 functions as a constant current source when it is applied with the bias voltage at its gate. As a result, the third differential amplifier circuit 30 amplifies the difference between the strobe signal BDQS and the reference voltage VREF, thereby outputting the differentially-amplified signal d. The differentially-amplified signal d is input into the inverter circuits 60. The inverter circuits 60 shapes a wave pattern of the signal d, and outputs a signal /BDQS having reversed phase with respect to the strobe signal BDQS.

Note that corresponding transistors in the first differential amplifier circuit 10, the second differential amplifier circuit 20, and the third differential amplifier circuit 30 may have the same structural feature (for example, a gate length, a gate width, and a film thickness of the gate insulation film). For example, the PMOS transistors QP1, QP3, and QP5 may have the same structural feature. In other words, the first to third differential amplifier circuits 10 to 30 may have the same structure except for the inverter circuits 40 to 60. The data latch circuit 70 comprises inverters INV1, INV2, a first latch circuit L1 and a second latch circuit L2.

The inverter INV1 includes PMOS transistors QP7, QP8 and NMOS transistors QN10, QN11 corrected in series between a power supply voltage terminal and a ground voltage terminal.

Also, the inverter INV2 includes PMOS transistors QP9, QP10 and NMOS transistors QN12, QN13 connected in series between a power supply voltage terminal and a ground voltage terminal. In the inverter INV1, the signal Din is input into the gates of the PMOS transistor QP7 and the NMOS transistor QN11. Also, the above-mentioned signals /BDQSi and /DQSi are input into the PMOS transistor QP8 and the NMOS transistor QN10, respectively.

In the inverter INV2, the signal Din is input into the gates of the PMOS transistor QP9 and the NMOS transistor QN13. This is similar to the operation in the inverter INV1. However, in the inverter INV2, the signal /DQSi is input into the gate of the MOS transistor QP10, and the signal /BDQSi is input into the gate of the NMOS transistor QN12. This is different from the operation in the inverter INV1 (reversed). The latch circuit L1 is configured by connecting inverters INV3 and INV4 to in a cross-coupling manner, and the input terminal of the inverter INV3 is connected to an output terminal of the inverter INV1. The latch circuit L2 is also configured by connecting inverters INV5 and INV6 to in a cross-coupling manner, and the input terminal of the inverter INV5 is connected to an output terminal of the inverter INV2.

Figure 2A:
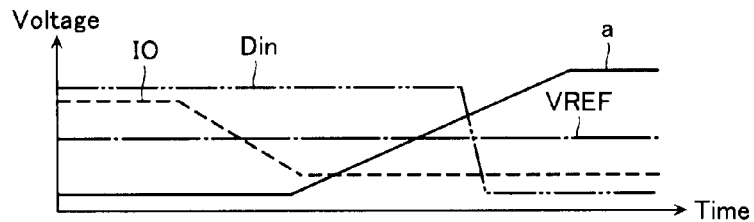
FIGS. 2A and 2B show the operation of the input circuit according to the first embodiment.
Figure 2B:
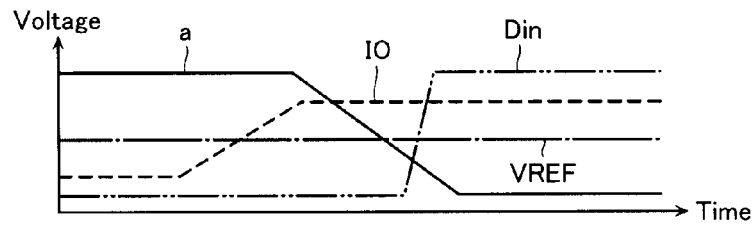

Referring now to FIG. 2A and 2B, the operation of the first differential amplifier circuit 10 will be described. As described above, the first differential amplifier circuit 10 amplifies the difference between the reference voltage VREF and the input signal 10, thereby outputting a differentially-amplified signal a. The reference voltage VREF is a voltage having a fixed voltage value that is substantially half of the amplitude of the input signal IO. As shown in FIG. 2A, when the input signal IO drops from "H" (the power supply voltage Vcc) to "L" (the ground voltage Vss) and becomes equal to the reference voltage VREF or less, the differentially-amplified signal a rises from "L" to "H". On the contrary, as shown in FIG. 2B, when the input signal IO rises from "L" to "H" and becomes higher than the reference voltage VREF, the differentially-amplified signal a falls from "H" to "L".

If the reference voltage VREF fluctuates from a value of half of the power supply voltage Vcc, the following event may occur. That is, as shown in FIGS. 2A and 2B, the rise of the differentially-amplified signal a when the input signal IO falls from "H" to "L" may be different from the fall of the differentially-amplified signal a when the input signal IO rises from "L" to "H"(difference in slew rate). The difference in slew rate causes the phase difference of the rise and fall of the signal Din after wave pattern shaping. FIGS. 2A and 2B illustrates a case where the slew rate of the differentially-amplified signal a when the input signal IO falls from "H" to "L" is smaller than that when the input signal IO rises from "L" to "H".

Next, with reference to FIG. 3A to 3D, the operations of the second differential amplifier circuit 20 and the third differential amplifier circuit 30 will be described.

The second differential amplifier circuit 20 amplifies the difference between the reference voltage VREF and the strobe signal DQS, thereby outputting a differentially-amplified signal c. The differentially-amplified signal c is input into the inverter circuits 50. Thereby, a signal /DQS having a reversed phase with respect to the strobe signal DQS is generated.

The third differential amplifier circuit 30 amplifies the difference between the reference voltage VREF and the strobe signal BDQS, thereby outputting the differentially-amplified signal d.

The differentially-amplified signal d is input into the inverter circuits 60, thereby a signal /BDQSi having a reversed phase with respect to the strobe signal BDQS being generated.

In these second differential amplifier circuit 20 and the third differential amplifier circuit 30, the rise of the signal c(d) when the strobe signal DQS(BDQS) falls maybe different from the fall of the signal c(d) when the strobe signal DQS (BDQS) rises, thereby generating a phase difference between the signals /DQSi and /BDQSi after wave-pattern shaping. FIGS. 3A to 3D show the case where the signals c and d each have a smaller slew rate when the strobe signal DQS or BDQS falls as compared to when the the strobe signal DQS or BDQS rises. As described above, the signals Din, /DQSi and /BDQSi each have a phase difference between when the input signal IO, the strobe signal DQS or BDQS rises and when they fall. If the characteristics of transistors used in the differential amplifier circuits 10, 20 and 30 are inferior, the difference in slew rate further deteriorates. A worse slew rate may cause a margin (a timing margin) relating to a timing when the input signal IO is latched to be small. This may cause, in some cases, a false data latch operation.

However, in the first embodiment, the data latch circuit 70 operates as follows. This may restrict the influence caused by the difference in slew rate, and a timing margin can be widened. Here, the operation of the data latch circuit 70 will be described.

Figure 4A:
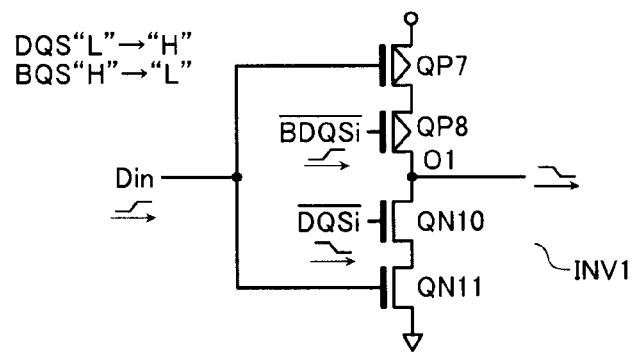
FIG. 4A to FIG. 4D show the operation of the input circuit according to the first embodiment.
Figure 4B:
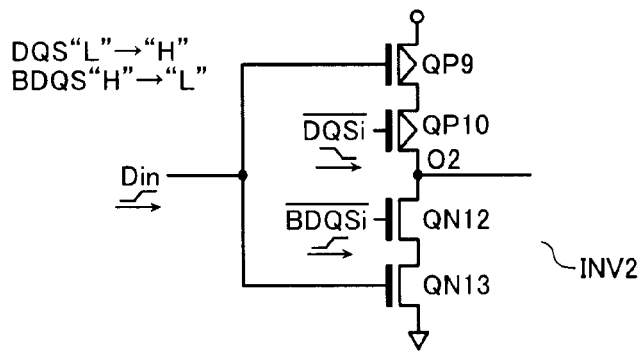

With reference to FIG. 4A and FIG. 4B, the operation of the inverters INV1 and INV2 included in the data latch circuit 70 is described. The operation of the data latch circuit 70 is explained hereinbelow, the explanation being divided into two cases (1) and (2).

(1) The operation at a timing when the strobe signal DQS is switched from "L" to "H", and the strobe signal BDQS is switched from "H" from "L"

Figure 3A:
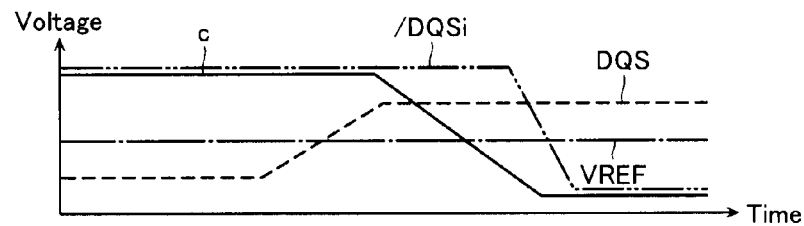
FIG. 3A to FIG. 3D show the operation of the input circuit according to the first embodiment.
Figure 3B:
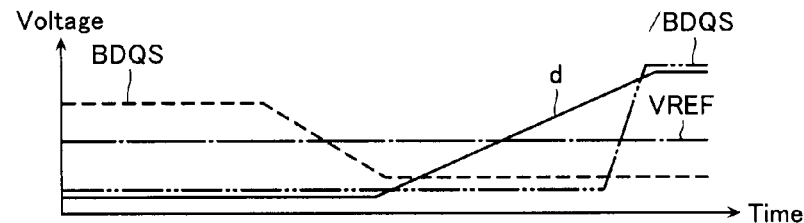

First, with reference to FIG. 4A, the operation of the inverter INV1 at a timing when the strobe signal DQS is switched from "L" to "H" and the strobe signal BDQS is switched from "H" to "L" as shown in FIGS. 3A and 3B is described.

When the input signal IO and the signal Din are switched from "L" to "H" at this timing as shown in FIG. 2B, the transistor QN11 in the inverter INV1 is switched from a non-conductive state to a conductive state, thereby switching the potential of the output terminal O1 in the inverter INV1 from "H" to "L".

At this time, the signal Din is supplied to the NMOS transistor QN11. It is also supplied to the PMOS transistor QP7. This allows the PMOS transistor QP7 to be switched from a conductive state to a no-conductive state. Even if the PMOS transistor QP8 is in a conductive state, this merely terminates the state where the output terminal O1 is charged to "H". It does not reverse the state of the output terminal O1, or does not force the output terminal O1 to store "H". In addition, even if the PMOS transistor QP8 changes to the non-conductive state earlier than the change of the input signal Din, it merely terminates at that timing the state where the output terminal O1 is being charged to "H".

Thereafter, the signal /DQSi is switched adversely from "H" to "L" (FIG. 3A), thereby switching the NMOS transistor QN10 to a non-conductive state, and switching the inverter INV1 to a non-operating state (cut-off state). Also, the latch circuit L1 keeps storing a signal "L" at the input signal IO. That is, when the input signal IO rises to "H", the rise of the strobe signal DQS having the same phase as the input signal IO allows the data latch.

As described above, the fall of the signal /BDQSi input into the gate of the PMOS transistor QP8, as well as the fall of the signal BDQSi having a reversed phase with respect to the input signal IO as an original signal does not contribute to the timing of latch of data in the input signal IO.

Then, with reference to FIG. 4B, the operation of the the inverter INV2 at a timing when the strobe signal DQS is switched from "L" to "H" and the strobe signal BDQS is switched from "H" to "L" will be described.

When the input signal IO and the signal Din are switched from "L" to "H" at this timing, the transistor QN13 in the inverter INV2 is switched from a non-conductive state to a conductive state, thereby the PMOS transistor QP9 being switched from the conductive state to the non-conductive state. Also, the signal /BDQSi is switched from "L" to "H" like the signal Din, thereby the NMOS transistor QN12 being switched to the conductive state. In addition, the signal /DQSi is switched from "H" to "L". This allows the PMOS transistor QP10 to be switched to the conductive state. Due to this, the inverter INV2 continues its operating condition even after a logic change of the signal Din. In other words, the inverter INV2 does not change to a cut-off state, and the input signal IO is allowed to be entered thereto after that. The logic change of the input signal IO is not latched in the latch circuit L2.

As described above, when the input signal IO and the signal Din are switched from "L" to "H" in the data latch circuit 70 shown in FIG. 1, the input signal IO is latched only in the latch circuit L1 based on the signal /DQSi generated from the strobe signal DQS. The input signal IO is not latched in the latch circuit L2.

(2) The operation at timing when the strobe signal DQS is switched from "H" to "L", and the strobe signal BDQS is switched from "L" from "H"

Figure 3C:
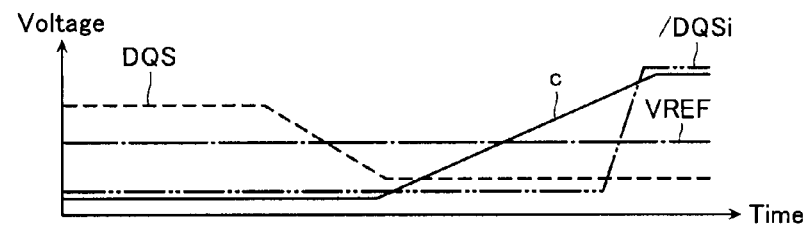
Figure 3D:
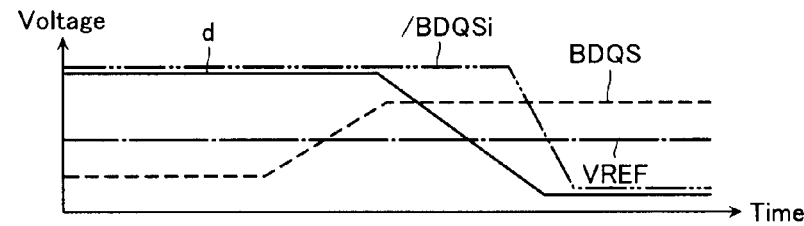
Figure 4C:
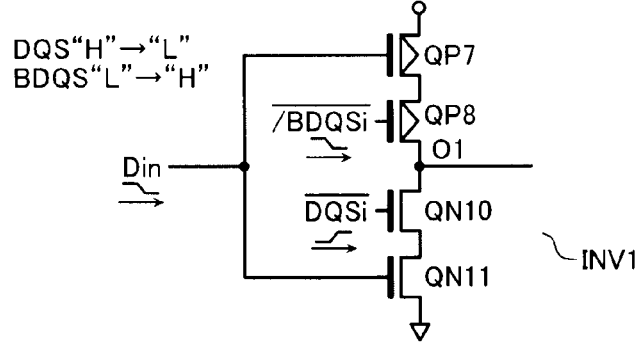

Next, with reference to FIG. 4C, the operation of the inverter INV1 at a timing when the strobe signal DQS is switched from "H" to "L" and the strobe signal BDQS is switched from "L" to "H" as shown in FIGS. 3C and 3D will be described.

When the input signal IO and the signal Din change from "H" to "L" at this timing, the transistor QP7 in the inverter INV1 is switched from the non-conductive state to the conductive state, and the NMOS transistor QN11 is switched from the conductive state to the non-conductive state. The signal /BDQSi is switched from "H" to "L", thereby switching the PMOS transistor QP8 to a conductive state. In addition, the signal /DQSi changes from from "L" to "H", and the NMOS transistor QN10 changes to the conductive state. This allows the inverter INV1 to continue its operating condition after the logic change of the signal Din. In other words, the inverter INV1 is not switched to the cut-off state, and the input signal IO may be allowed to be input after that. Also, the logic change of the input signal IO is not latched in the latch circuit L1.

Figure 4D:
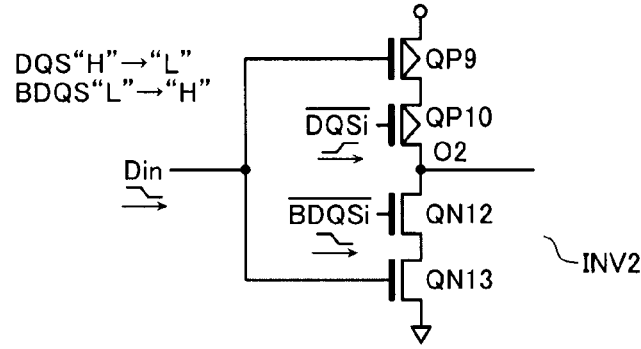

Next, with reference to FIG. 4D, the operation of the inverter INV2 at a timing when the strobe signal DQS is switched from "H" to "L" and the strobe signal BDQS is switched from "L" to "H" as shown in FIGS. 3C and 3D will be described.

When the input signal IO and the signal Din are switched from "H" to "L" at this timing, the transistor QP9 in the inverter INV2 is switched from the non-conductive state to a conductive state. On the other hand, the signal /DQSi is adversely switched from to "H" (FIG. 3C), thereby switching the PMOS transistor QP10 to the non-conductive state and switching the inverter INV2 to the non-operating state (the cut-off state). Thus, the above-mentioned logic change of the input signal IO is latched by the latch circuit L2.

In this case, the input signal Din is input into the PMOS transistor QP9 and is also input to the NMOS transistor QN13. This allows the NMOS transistor QN13 to change from the conductive state to the non-conductive state. Even if the NMOS transistor QN12 is in a conductive state, this merely terminates the state where the output terminal O1 is discharged to "L". This does not invert the state of the output terminal O1, or does not force the output terminal O1 to store "L". In addition, even if the NMOS transistor QN12 becomes the non-conductive state prior to the change of the input signal Din, this merely terminates the state where the output terminal is discharged to "L" at that timing. In other words, when the input signal IO drops to "L", a data latch operation is conducted due to a drop of the strobe signal DQS which has the same phase as the input signal IO. In this way, the rise of the signal /BDQSi, which is supplied to the gate of the NMOS transistor QN12, and the rise of the signal BDQSi, which is a reversed-phase signal with respect to the input signal IO (an original signal thereof) do not contribute to the timing of the data latch of the input signal IO.

In the above explanation, FIGS. 4A-D have been used to explain the mechanism of how the data of the input signal IO that has the same phase as the strobe signal DQS is latched only by the strobe signal DQS, regardless of the strobe signal BDQS that has the reversed phase with respect to the strobe signal DQS. Although explanation of operation is omitted here because an operation of the circuit is symmetric, the data of the input signal IO that has the same phase as the strobe signal BDQS is latched only by the strobe signal BDQS, regardless of the strobe signal DQS.

Thus, in this first embodiment, when the input signal IO is switched from "L" to "H" at the edge of the strobe signal DQS rising from "L" to "H", a latch operation is conducted as follows. That is, a latch operation is conducted in the latch circuit L1 for the signal Din that is generated from the signal a with a high slew rate and is early in phase, based on the signal /DQSi that is generated from the signal c with a high slew rate similarly, and is early in phase.

On the other hand, when the input signal IO is switched from "H" to "L", a latch operation is conducted as follows. That is, a latch operation is conducted in the latch circuit L1 for the signal Din that is generated from the signal a with a low slew rate and is late in phase, based on the signal /BDQSi that is generated from the signal d with a low slew rate similarly, and is late in phase.

When an edge of the signal DQS transitions from "H" to "L", the signal Din that is early in phase is latched in the latch circuit L2 by the signal that is early in phase. The signal Din that is late in phase is latched in the latch circuit L2 by the signal that is late in phase. The latch operation in the latch circuit L2 is in a self-alignment manner like in the latch circuit L1. In this way, the input signal may be latched in the latch circuit at an appropriate timing even if a slew rate fluctuates.

Figure 8:
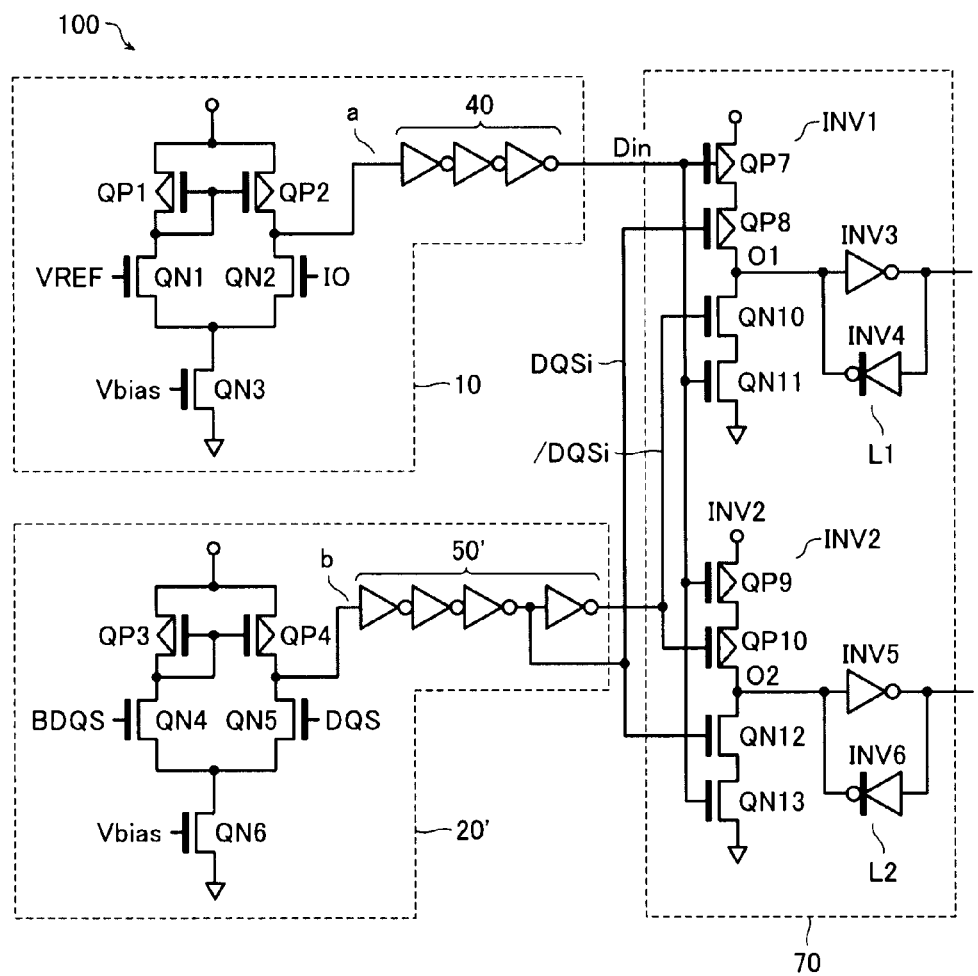
FIG. 8 shows a comparative example of the embodiments.

The advantage of the first embodiment will be explained with reference to a comparative example shown in FIG. 8. In FIG. 8, the components that are the same as those in FIG. 1 are assigned with the same reference numerals.

Figure 9A:
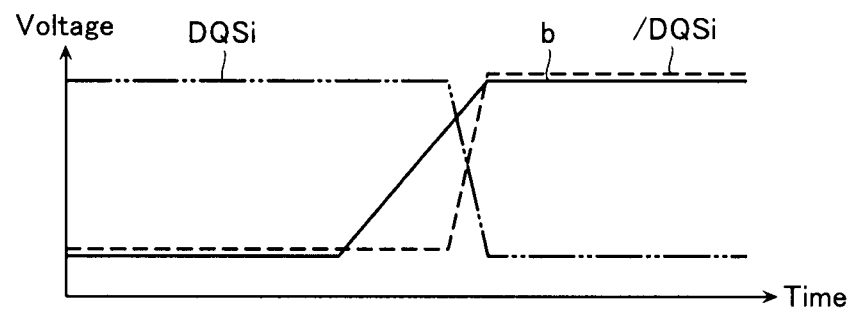
FIG. 9A to FIG. 9B show a comparative example of the embodiments.
Figure 9B:
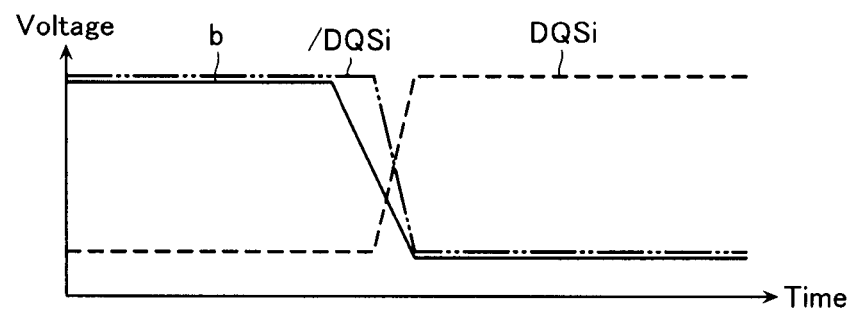

In the comparative example of this FIG. 8, the differential amplifier circuit 20' is configured to amplify the difference between the strobe signal DQS and the strobe signal BDQS that is a complementarity signal of the strobe signal DQS, to output a differentially-amplified signal b. The inverter circuits 50' generates a signal DQSi that has the same phase as the strobe signal DQS and a signal /DQSi that has a reversed phase, based on the differentially-amplified signal b. In order to express the logic of the signal in a simplified manner, FIG. 8 illustrates the inverter circuits 50' as four inverters that are cascade-connected. If similar logic of signals can be obtained, it is possible that a logic circuit such as a NAND gate or NOR gate, a transmission gate, or a delay circuit may be further included herein. The data latch circuit 70 has inverters INV1 and INV2 controlled by these signals DQSi and /DQSi. According to this arrangement, the logic of the signal b changes when a cross point between the strobe signal DQS and BDQS is detected. In this case, a potential difference of the input signals per unit time becomes larger than in a method that differentially amplifies the strobe signal and a reference voltage VREF. Accordingly, it is possible to enlarge the slew rate of the signal b, and as a result, the phase of the signals DQSi and /DQSi becomes earlier (FIG. 9).

However, regarding the input signal IO, a method of differentially amplifying the input signal IO and the reference voltage VREF to output a differentially-amplified signal a and the signal Din is adopted (a single end method). It is not such a realistic idea to adopt a method (a differential method) that generates a complementally signal /IO with respect to the input signal IO to detect a cross point thereof. This is because it leads to an increase in the number of pins for data input in a semiconductor memory device and increase in circuit area.

As noted above, when a single-end method is adopted for the input signal IO, while a strobe signal DQS and a complementary signal BDQS are adopted as strobe signals, there arises a big difference between the internal signals as described above. Due to this, a correct data latch becomes difficult, which is considered as a problem.

On the other hand, according to the present embodiment, the input signal IO is input by the single end method that detects the logical change by differentially-amplifying the input signal IO and the reference voltage VREF. Furthermore, a differential amplification method using the reference voltage VREF is adopted also for the strobe signals DQS and BDQS. Configuring the data latch circuit 70 as described above, a slew rate or a phase difference are adjusted in a self-alignment manner, thereby enabling the input signal to be latched appropriately.

[Second Embodiment]

Next, the second embodiment is described with reference to FIG. 5.

Figure 5:
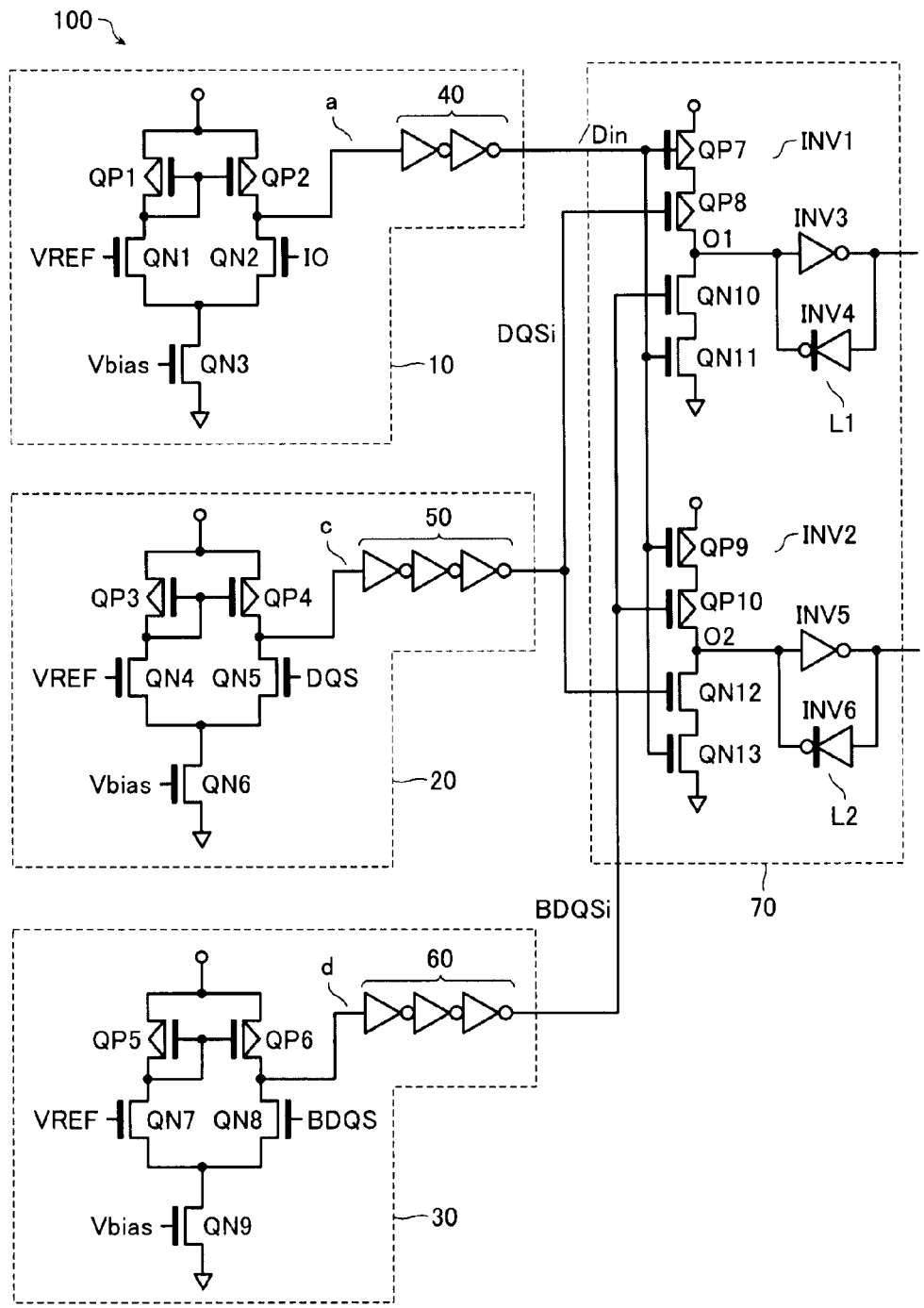
FIG. 5 is an equivalent circuit diagram illustrating the structure of the input circuit according to the second embodiment.
Figure 6A:
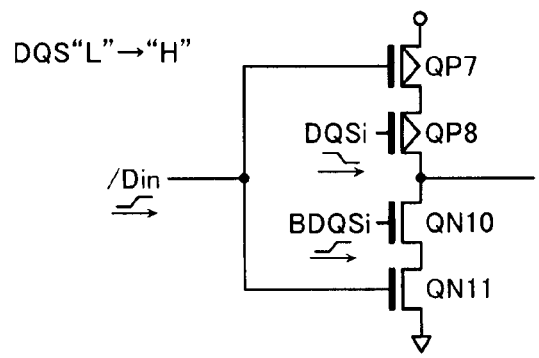
FIG. 6A to FIG. 6D show the operation of the input circuit according to the second embodiment.
Figure 6B:
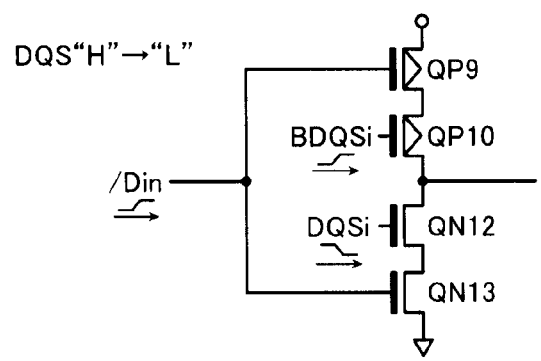
Figure 6C:
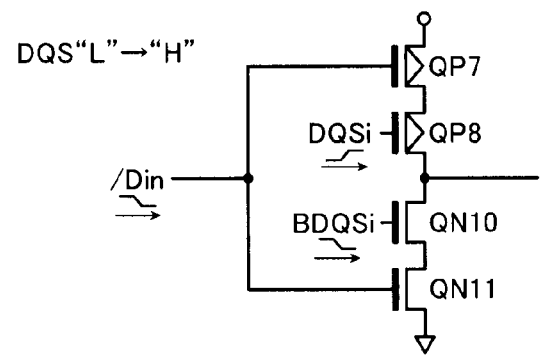
Figure 6D:
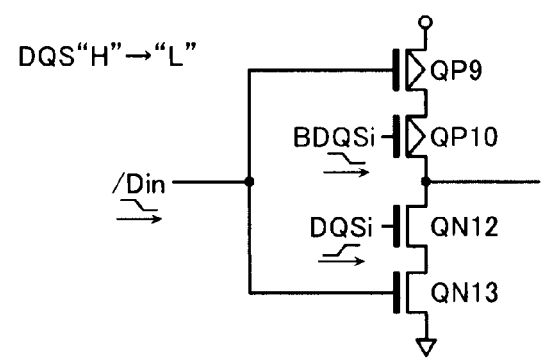

In the second embodiment shown in this FIG. 5, the phases of the signals provided to the inverters INV1 and INV2 are reversed with respect to the first embodiment. The connection in the inverters is switched as compared to the first embodiment.

That is, in the inverter INV1, the signal DQSi is supplied to the gate of the PMOS transistor QP8, and the signal BDQSi is supplied to the gate of the NMOS transistor QN10. In the inverter INV2, the signal BDQSi is supplied to the gate of the PMOS transistor QP10, and the signal DQSi is supplied to the gate of the NMOS transistor QN12. The phase of the input signal Din is reversed with respect to the first embodiment. The input signal /Din is supplied to the gates of the transistors QP7, QN11, QP9, and QN13.

The operation of the second embodiment is shown in FIG. 6A-FIG. 6D. In this second embodiment, when the input signal IO is switched from "L" to "H" at the edge of the strobe signal DQS rising from "L" to "H", i.e., when the signal /Din is switched from "H" to "L" inside the circuit, the signal DQSi changes from "L" to "H", thereby data being latched in the latch circuit L1.

On the other hand, when the input signal IO is switched from "H" to "L", i.e., when the signal /Din is switched from "L" to "H" inside the circuit, the signal DQSi changes from "H" to "L", thereby data being latched in the latch circuit L2.

Likewise, when the input signal IO is switched from "L" to "H", i.e., when the signal /Din is switched from "H" to "L" inside the circuit, the signal BDQSi changes from "L" to "H", thereby data being latched in the latch circuit L2. Because the operation is similar to the first embodiment, the detailed description thereof is omitted here. According to this embodiment, an advantage similar to that of the first embodiment may be obtained.

Figure 7:
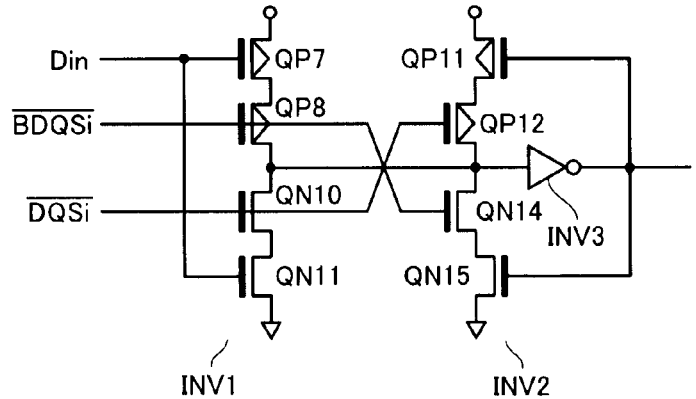
FIG. 7 is an equivalent circuit diagram showing an example of the structure of the input circuit according to the first embodiment.

FIG. 7 is a circuit diagram showing the input circuits of the first embodiment. In general, in the latch circuit for latching the input signal Din, a PMOS transistor QP12 and an NMOS transistor QN14 tend to be more dominant than a PMOS transistor QP8 and an NMOS transistor QN10. Accordingly, in the circuit, signals /BDQS and /DQS are often generated to have a timing that is late compared to the input signal Din, the timing corresponding to two-stage inverters in the latch circuit. In FIG. 7, the gates of the PMOS transistor QP8 and the NMOS transistor QN14 are connected to the same node, while the gates of the NMOS transistor QN10 and the PMOS transistor QP12 are connected to the same node. However, they only need to have substantially the same phase. It is not necessary to connect these gates to the same node. For example, an input signal to the gate of the NMOS transistor QN14 (PMOS transistor QP12) may be late compared to an input signal to the gate of the PMOS transistor QP8 (NMOS transistor QN10), the amount of retard corresponding to one or two-stage inverters. Note that although FIG. 7 illustrates the latch circuit L1 only, the latch circuit L2 may have the same structure.

The inverter INV2 in the latch circuit L1 according to this embodiment comprises PMOS transistors QP11, QP12, and NMOS transistors QN14, QN15 that are connected in series between a power supply voltage terminal and a ground voltage terminal. An output terminal of the inverter INV3 is connected to the gates of the PMOS transistor QP11 and the NMOS transistor QN15. These gates function as a data node of the latch circuit L1. In addition, the signals /DQSi and /BDQSi are input into the gates of the PMOS transistor QP12 and the NMOS transistor QN14, respectively. This allows the latch circuit L1 to be in an operable state only at timing when data shall be latched. According to the second embodiment, a latch operation in the latch circuits L1 and L2 may be performed at an appropriate timing.

[Others]

While certain embodiments of the inventions have been described, these embodiments have been presented by way of example only, and are not intended to limit the scope of the inventions. Indeed, the novel methods and systems described herein may be embodied in a variety of other forms; Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 10:
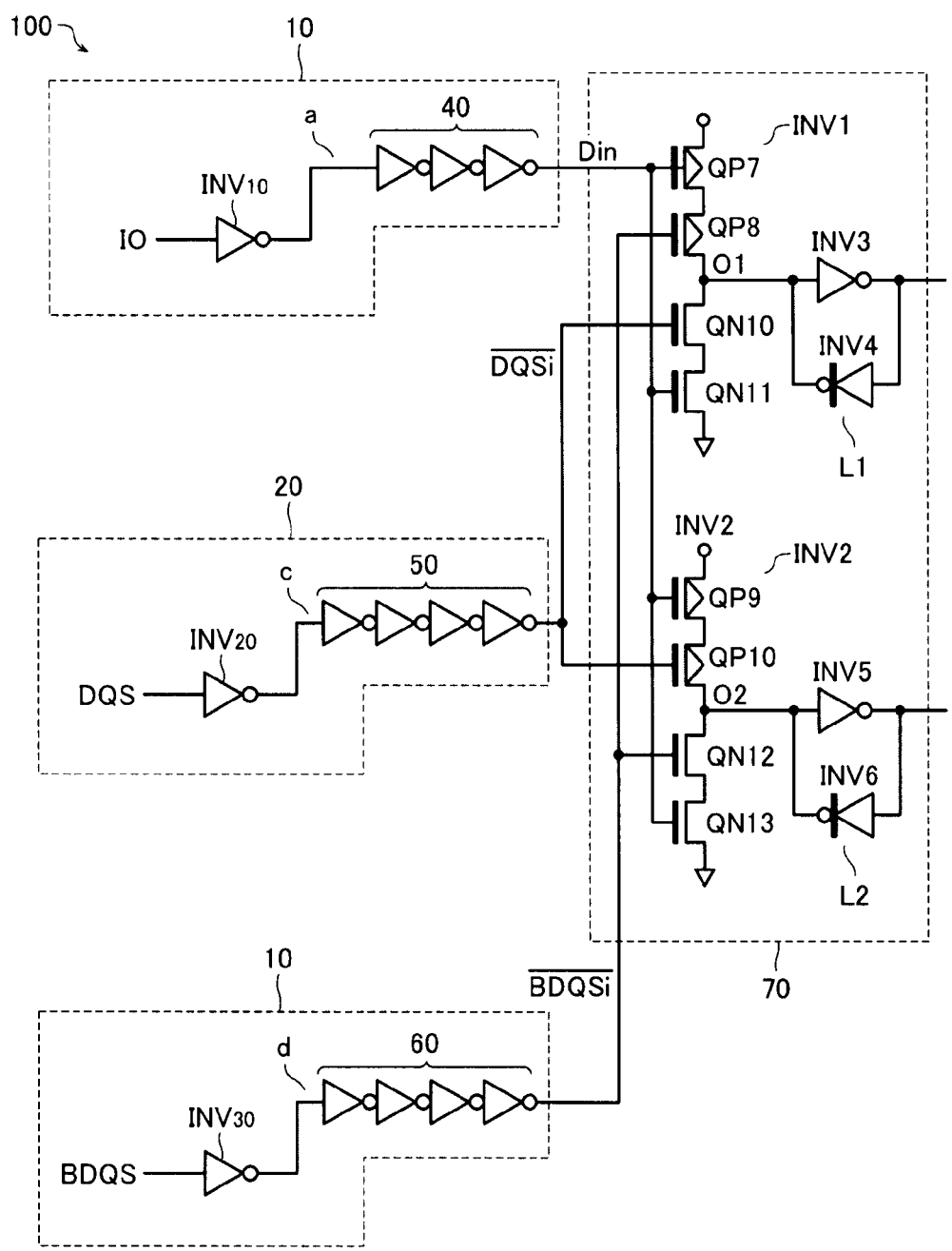
FIG. 10 shows a variation of the embodiments.

For example, in the above-described embodiments, the first to third input circuits include a differential amplifier circuit. As shown in FIG. 10, the differential amplifier circuit may be replaced by an inverter. When the input circuit includes an inverter, not the reference signal but the threshold voltage of the circuit itself may determine an output signal in response to the input signal.

Figure 11:
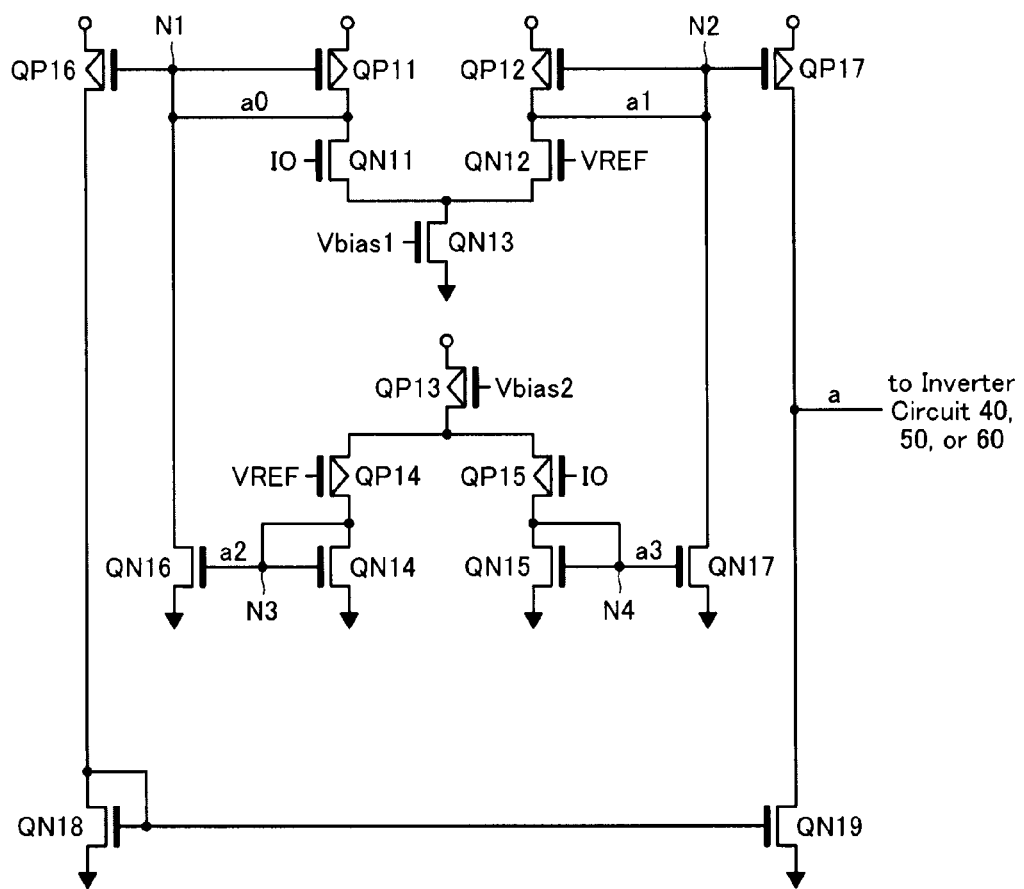
FIG. 11 shows a variation of the embodiments.

Also, the differential amplifier circuits 10 to 30 may be replaced by a circuit as shown in FIG. 11. The circuit shown in FIG. 11 is constructed by PMOS transistors QP11 to QP17 and NMOS transistors QN11 to QN19.

The PMOS transistors QP11 and QP12 have sources connected to a power supply voltage terminal. The PMOS transistor QP11 is diode-connected, and its gate (a node N1) is connected to the gate of the PMOS transistor QP16. The PMOS transistor QP12 is also diode-connected, and its gate (a node N2) is connected to the gate of the PMOS transistor QP17. The NMOS transistors QN11 and QN12 have drains connected to the drains of the PMOS transistors QP11 and QP12, respectively. In addition, the gates of the NMOS transistors QN11 and QN12 are supplied with the input signal IO and the reference voltage VREF, respectively, in an operable state. The NMOS transistor QN13 is connected between the sources of the MOS transistors QN11 and QN12 and the ground terminal. Also, its gate is supplied with the bias voltage Vbias1.

The transistors QP11, QP12, QN11, QN12 and QN13 form one differential amplifier circuit. The transistor QN13 functions as a constant current source when its gate is provided with a bias voltage Vbias1. This differential amplifier circuit may include an NMOS transistor (not shown) connected between the NMOS transistor QN3 and the ground terminal. When this NMOS transistor (not shown) is turned on, the differential amplifier circuit amplifies the difference between the input signal IO and the reference voltage VREF to output differentially-amplified signals a0 and a1.

Also, the PMOS transistor QP13 is connected between the power supply voltage terminal and the sources of the PMOS transistors QP14 and QP15. A bias voltage Vbias2 is supplied to the gate of the PMOS transistor QP13. The transistor QP13 functions as a constant current source when its gate is provided with a bias voltage Vbias2. For example, a PMOS transistor (not shown) may be connected between the PMOS transistor QP13 and a voltage supply terminal. When this PMOS transistor (not shown) is turned on, the difference between the input signal IO and the reference voltage VREF is amplified, thereby differentially-amplified signals a2 and a3 being output. The gates of the NMOS transistors QP14 and QP15 are supplied with the reference voltage VREF and the input signal IO, respectively. The drains of the NMOS transistors QN14 and QN15 are connected to the drains of the PMOS transistors QP14 and QP15, respectively. The PMOS transistors QP14 and QP15 have sources connected to a ground terminal. The NMOS transistors QN14 and QN15 are diode-connected, and their gates (nodes N3 and N4) are connected to the gates of the NMOS transistors QN16 and QN17, respectively. The NMOS transistors QN16 is connected between the gate (the node N1) of the PMOS transistor QP11 and the ground terminal. The NMOS transistor QN17 is connected between the gate (the node N2) of the PMOS transistor QP12 and the ground terminal.

The PMOS transistors QP13 to QP15 and the NMOS transistors QN14 to QN15 comprise one differential amplifier circuit. This differential amplifier circuit outputs differentially-amplified signals a2 and a3 from the nodes N3 and N4. The magnitudes of the differentially-amplified signals a2 and a3 may change the currents flowing through the NMOS transistors QN16 and QN17. This causes the potentials of the nodes N1 and the N2 to change.

When the input signal IO becomes lower than the reference voltage VREF, the differentially-amplified signal a0 becomes higher than the differentially-amplified signal a1, and The differentially-amplified signal a3 becomes higher than the differentially-amplified signal a2.

In contrast, when the input signal IO becomes higher than the reference voltage VREF, the differentially-amplified signal a0 becomes lower than the differentially-amplified signal a1, and The differentially-amplified signal a3 becomes lower than the differentially-amplified signal a2. It can be said that the differentially-amplified signal a0 and a2 are in complementary relationship, and the differentially-amplified signal a1 and a3 are in complementary relationship.

When the the differentially-amplified signal a0 becomes lower than the differentially-amplified signal a1, differentially-amplified signal a2 becomes higher than the differentially-amplified signal a3. This allows the current flowing through the NMOS transistor QN16 to become larger, thereby lowering the potential of the node N1 quickly.

On the other hand, when the the differentially-amplified signal a0 becomes higher than the differentially-amplified signal a1, differentially-amplified signal a2 becomes lower than the differentially-amplified signal a3. This allows the current flowing through the NMOS transistor QN16 to become smaller, thereby raising the potential of the node N1 quickly. This holds true for the node N2.

The NMOS transistor QN18 is connected between the drain of the PMOS transistor QP16 and the ground terminal, and is diode-connected. Likewise, the NMOS transistor QN19 is connected between the drain of the PMOS transistor QP17 and the ground terminal, and is diode-connected. Also, the gates of the PMOS transistor QN18 and QN19 are commonly connected. The connection node between the PMOS transistor QN17 and the NMOS transistor QN19 outputs the differentially-amplified signal a.

Furthermore, when the node N1 has a high potential, the node N2 has a low potential. When the node N1 has a low potential, the node N2 has a high potential. That is, the nodes N1 and N2 have a complementary relationship. For example, when the potential of the node N1 is lower than the potential of the node N2, the transistors QP16, QP17, and QP19 are turned on. Since the node N2 is at a high level, the transistor QN17 is turned off. This allows the differentially-amplified signal a to be output as "L" data quickly.

What is claimed is:

1. An input circuit, comprising:
an first input circuit configured to detect an input signal to output a first output signal having the same phase as the input signal;
a second input circuit configured to detect a first strobe signal to output a second output signal;
a third input circuit configured to detect a second strobe signal as a reversed signal of the first strobe signal to output a third output signal; and
a data latch circuit including a first latch circuit and a second latch circuit, and configured to latch the first output signal in either one of the first latch circuit or the second latch circuit according to the first output signal, the second output signal and the third output signal, and to allow the other one of the first latch circuit or the second latch circuit to input the first output signal thereto.

2. The input circuit according to claim 1, wherein the second output signal has a reversed phase with respect to the first strobe signal, and the third output signal has a reversed phase with respect to the second strobe signal.

3. The input circuit according to claim 1, wherein the data latch circuit further comprises:

a first inverter circuit having input terminals supplied with the first output signal, the second output signal and the third output signal to supply an output signal to the first latch circuit; and
a second inverter circuit having input terminals supplied with the first output signal, the second output signal and the third output signal to supply an output signal to the second latch circuit.

4. The input circuit according to claim 3, wherein the first latch circuit or the second latch circuit includes a third PMOS transistor, a fourth PMOS transistor, a third NMOS transistor and a fourth NMOS transistor connected in series,
gates of the third PMOS transistor and the fourth NMOS transistor function as a data node, and
the fourth PMOS transistor and the third NMOS transistor are conduction-controlled based on the second output signal and the third output signal.

5. The input circuit according to claim 3, wherein the first inverter circuit and the second inverter circuit each includes a first PMOS transistor, a second PMOS transistor, a first NMOS transistor and a second NMOS transistor connected in series,
either one of the first inverter circuit or the second inverter circuit is supplied with the first input signal to gates of the first PMOS transistor and the second NMOS transistor, and is supplied with the third output signal to the second PMOS transistor while it is supplied with second output signal to the first NMOS transistor,
the other one of the first inverter circuit or the second inverter circuit is supplied with the first input signal to gates of the first PMOS transistor and the second NMOS transistor, and is supplied with the second output signal to the second PMOS transistor while it is supplied with third output signal to the first NMOS transistor.

6. The input circuit according to claim 1, wherein the first to third input circuits includes a differential amplifier circuit.

7. The input circuit according to claim 6, wherein the differential amplifier circuit is supplied with the input signal and the first strobe signal or the second strobe signal as input signals thereto.

8. The input circuit according to claim 6, wherein differential amplifier circuits in the first to third input circuits has the same structural feature.

9. The input circuit according to claim 1, wherein the first to third input circuits each includes an inverter.

10. An input circuit comprising:
an first input circuit configured to detect an input signal to output to a first signal line a first output signal having the same phase as the input signal;
a second input circuit configured to detect a first strobe signal to output to a second signal line a second output signal;
a third input circuit configured to detect a second strobe signal as a reversed signal of the first strobe signal to output a third output signal to a third signal line;
a first latch circuit including a first PMOS transistor, a second PMOS transistor, a first NMOS transistor, and a second NMOS transistor connected in series; and
a second latch circuit including a third PMOS transistor, a fourth PMOS transistor, a third NMOS transistor, and a fourth NMOS transistor connected in series,
the first signal line being connected to the gates of the first PMOS transistor, the third PMOS transistor, the second NMOS transistor, and the fourth NMOS transistor, the second signal line being connected to the gates of the first NMOS transistor and the fourth PMOS transistor, and the third signal line being connected to the gates of the second PMOS transistor and the third NMOS transistor.

11. The input circuit according to claim 10, wherein the second output signal has a reversed phase with respect to the first strobe signal, and the third output signal has a reversed phase with respect to the second strobe signal.

12. The input circuit according to claim 10, wherein the first to third input circuits includes a differential amplifier circuit.

13. The input circuit according to claim 12, wherein the differential amplifier circuit is supplied with the input signal, and the first strobe signal or the second strobe signal as input signals thereto.

14. The input circuit according to claim 13, differential amplifier circuits in the first to third input circuits has the same structural feature.

15. The input circuit according to claim 10, wherein the first to third input circuit each comprise an inverter.

\* \* \* \* \*